(12) United States Patent
Jang et al.

(10) Patent No.: US 12,451,862 B2
(45) Date of Patent: Oct. 21, 2025

(54) SURFACE ACOUSTIC WAVE WAFER LEVEL PACKAGES WITH ORGANIC SOLDERABILITY PRESERVATIVE COATING LAYERS AND MANUFACTURING METHODS THEREOF

(71) Applicant: WISOL CO., LTD., Gyeonggi-do (KR)

(72) Inventors: Suk Hwan Jang, Gyeonggi-do (KR); Byung Hak Kim, Gyeonggi-do (KR); Chang Yup Lee, Gyeonggi-do (KR)

(73) Assignee: WISOL CO., LTD., Gyeonggi-Do (KR)

( * ) Notice: Subject to any disclaimer, the term of this patent is extended or adjusted under 35 U.S.C. 154(b) by 901 days.

(21) Appl. No.: 17/348,154

(22) Filed: Jun. 15, 2021

(65) Prior Publication Data

US 2022/0006440 A1  Jan. 6, 2022

(30) Foreign Application Priority Data

Jul. 6, 2020 (KR) .................. 10-2020-0082868

(51) Int. Cl.
*H03H 3/08* (2006.01)
*H03H 9/05* (2006.01)
(Continued)

(52) U.S. Cl.
CPC ............ *H03H 9/1092* (2013.01); *H03H 3/08* (2013.01); *H03H 9/059* (2013.01); *H03H 9/25* (2013.01)

(58) Field of Classification Search
CPC ........ H03H 9/25; H03H 9/059; H03H 9/1092; H03H 3/08
(Continued)

(56) References Cited

U.S. PATENT DOCUMENTS 10,716,208 B1 *   7/2020   Momose .............. H05K 3/4682
2005/0116352 A1 *   6/2005   Warashina ............. H03H 9/059
                                                          257/777
(Continued)

FOREIGN PATENT DOCUMENTS

CN          1808897 A      7/2006
CN        109964406 A      7/2019
(Continued)

OTHER PUBLICATIONS

Office Action from corresponding Korean Patent Application No. 10-2020-0082868, issued on Oct. 22, 2021.
(Continued)

*Primary Examiner* — Emily P Pham
*Assistant Examiner* — Monica Mata
(74) *Attorney, Agent, or Firm* — Harness, Dickey & Pierce, P.L.C.

(57) ABSTRACT

A surface acoustic wave wafer level package includes a substrate, an interdigital transducer (IDT) formed on the substrate, a sidewall formed on the substrate along a periphery of the IDT, a cover formed above the sidewall and the IDT to form a hollow above the IDT with the sidewall, a connection electrode formed on the substrate and extending outward from a periphery of the sidewall, a connection terminal electrically connected to a part of the connection electrode which extends outward from the periphery of the sidewall, and an organic solderability preservative coating layer formed on at least a top surface of the connection terminal.

1 Claim, 8 Drawing Sheets

(51) Int. Cl.
*H03H 9/10* (2006.01)
*H03H 9/25* (2006.01)

(58) Field of Classification Search
USPC .................................................. 310/313 B
See application file for complete search history.

(56) References Cited

U.S. PATENT DOCUMENTS

| | | | |
|---|---|---|---|
| 2010/0224972 A1* | 9/2010 | Powell | H01L 23/49541 |
| | | | 257/676 |
| 2012/0052631 A1* | 3/2012 | Mcmillan | H01L 23/49548 |
| | | | 438/111 |
| 2014/0131853 A1 | 5/2014 | Takemura | |
| 2017/0103945 A1* | 4/2017 | Kobayashi | H01L 21/561 |
| 2017/0179013 A1* | 6/2017 | Kunimoto | H01L 21/486 |
| 2018/0269853 A1 | 9/2018 | Lee et al. | |
| 2019/0190484 A1* | 6/2019 | Fukuda | H03H 9/145 |
| 2020/0106416 A1* | 4/2020 | Iwamoto | H03H 9/0576 |
| 2021/0037652 A1* | 2/2021 | Yamaguchi | H05K 1/115 |
| 2021/0045242 A1* | 2/2021 | Tanaka | H05K 3/4682 |
| 2021/0076491 A1* | 3/2021 | Kijima | H01L 23/49822 |
| 2021/0151379 A1* | 5/2021 | Kwon | H01L 21/561 |

FOREIGN PATENT DOCUMENTS

| | | |
|---|---|---|
| JP | 2017-112630 A | 6/2017 |
| KR | 10-2007-0057990 A | 6/2007 |
| KR | 10-1336150 B1 | 12/2013 |
| KR | 10-2020-0000058 A | 1/2020 |

OTHER PUBLICATIONS

Office Action from corresponding Chinese Patent Application No. 202110756802.5, dated Jun. 6, 2025.

* cited by examiner

SURFACE ACOUSTIC WAVE WAFER LEVEL PACKAGES WITH ORGANIC SOLDERABILITY PRESERVATIVE COATING LAYERS AND MANUFACTURING METHODS THEREOF

CROSS-REFERENCE TO RELATED APPLICATION

This application claims priority to and the benefit of Korean Patent Application No. 10-2020-0082868, filed on Jul. 6, 2020, the disclosure of which is incorporated herein by reference in its entirety.

FIELD

The present invention relates to a surface acoustic wave (SAW) device, and more particularly, to an SAW wafer level package and a method of manufacturing the same.

BACKGROUND

A surface acoustic wave (SAW) is an acoustic wave propagated along a surface of an elastic substrate. An acoustic wave is generated from an electrical signal as a result of a piezoelectric effect. An electric field of the acoustic wave may be concentrated on environs of the surface of the substrate and may interact with a conducting electron of another semiconductor disposed directly on the surface. A medium through which an acoustic wave is propagated is a piezoelectric material with a high electro-mechanical coupling efficient and a low acoustic wave energy loss, and a semiconductor may provide an optimal efficiency due to high mobility of a conducting electron, an optimal specific resistance, and a low direct current (DC) power element. An electronic circuit replaced with an electro-mechanical device using an interaction between the SAW and a semiconductor conducting electron is an SAW device.

Since wave energy of an SAW is propagated while concentrated on a solid surface, it is easy to control a signal and it is possible to miniaturize a device. Also, due to the advent of a piezoelectric material of high quality such as $LiNbO_3$, $LiTaO_3$, quartz, PZT, an interdigital transducer (IDT) is installed on the surface to easily and efficiently generate, detect, and control an SAW. As a result, various high functional electronic devices that process radio frequency signals with SAWs have studied and developed with increasing speed.

An SAW device is configured to install input electrode and output electrode having the shape of strands of strings at both ends with a thin metal film on a surface of a medium so that a high frequency into an SAW and, to detect radio wave properties using the output electrode to return to an electric signal. As an example of applying the same, there are a delay line device, an amplifier, a mode transformer, an optical beam deflector, an optical switch and the like.

In manufacturing such SAW devices and semiconductor devices, recently, unlike an existing method including wafer processing, cutting chips one by one, and packaging, a manufacturing method using a wafer level package (WLP) in which a package process and a test is performed at a wafer level at one time and complete products are simply manufactured by cutting chips has been generally used.

Through the WLP, packages as complete products may be manufactured at a wafer level, that is, in a state in which individual chips are not separated from a wafer. Also, existing wafer manufacturing facilities and processes may be used as they are for manufacturing facilities and manufacturing processes used for manufacturing packages. Since a packaging process is performed at a wafer level in the WLP process, in comparison to an existing method in which packaging is performed by an individual chip, several hundreds or several thousands of packages may be manufactured through one packing process so as to significantly reduce manufacturing costs and investment costs.

FIG. 1 illustrates a cross-sectional structure of an existing SAW wafer level package. As shown in the drawings, the SAW wafer level package includes a substrate 10, an IDT 20, a connection electrode 30 formed on the substrate 10 and electrically connected to the IDT 20, a sidewall 40 formed on the substrate 20 along a periphery of the IDT 20, a cover 50 formed above the sidewall 40 and the IDT 20 to form a hollow 45 above the IDT 20 with the sidewall 40, a connection terminal 60 electrically connected to the connection electrode 30 and protruding above the cover 50, and a tin-plating layer 70. The connection terminal 60 is generally formed of copper. Here, the tin-plating layer 70 is formed on a top surface of the connection terminal 60 so as to improve solderability when the SAW wafer level package is mounted on another substrate or the like.

SUMMARY

The existing surface acoustic wave (SAW) wafer level package has a structure in which the connection terminal 60 vertically passes through the sidewall 40 and the cover 50. Accordingly, since an area of the hollow 45 in which the IDT 20 is disposed is limited, there is a limitation in increasing a size or number of such IDTs 20.

Also, in the case of the existing SAW wafer level package, it is necessary to perform a complicated process including applying of photoresist, electroplating, eliminating of the photoresist, and the like to form the tin-plating layer 70 on the top surface of the connection terminal 60, and the process requires high-priced equipment and a long process time.

In addition, since it is necessary to form the tin-plating layer 70 having a certain thickness (for example, about 1 to 2 μm), a process in which a thickness of the tin-plating layer 70 is measured for each manufactured product and whether the product has fair quality is checked is being performed. The process further increases a lead time of the product.

The present invention is directed to providing a surface acoustic wave (SAW) wafer level package in which an area of a hollow that is a space in which an interdigital transducer (IDT) is disposed may be increased so that a size or number of such IDTs may be increased and a method of manufacturing the SAW wafer level package.

The present invention is also directed to providing an SAW wafer level package manufactured using a process time and lead time which are reducible and without need high-priced equipment and a method of manufacturing the SAW wafer level package.

It should be noted that the technical objectives of the present invention are not limited to the above-described objectives, and other objectives of the present invention will be apparent to those skilled in the art from the following descriptions.

According to an aspect of the present invention, there is provided an SAW wafer level package including a substrate, an IDT formed on the substrate, a sidewall formed on the substrate along a periphery of the IDT, a cover formed above the sidewall and the IDT to form a hollow above the IDT with the sidewall, a connection electrode formed on the substrate, electrically connected to the IDT, and extending outward from a periphery of the sidewall, a connection terminal electrically connected to a part of the connection electrode which extends outward from the periphery of the sidewall, formed throughout one outer surface of the sidewall and one surface and a part of a top surface of the cover, and having a top surface formed to be higher than the top surface of the cover, and an organic solderability preservative (OSP) coating layer formed on at least the top surface of the connection terminal.

The OSP coating layer may be formed on the top surface and a side surface of the connection terminal.

According to another aspect of the present invention, there is provided a method of manufacturing an SAW wafer level package. The method includes forming a base device including a substrate, an IDT formed on the substrate, a sidewall formed on the substrate along a periphery of the IDT, a cover formed above the sidewall and the IDT to form a hollow above the IDT with the sidewall, a connection electrode formed on the substrate, electrically connected to the IDT, and extending outward from a periphery of the sidewall, and a connection terminal electrically connected to a part of the connection electrode which extends outward from the periphery of the sidewall, formed throughout one outer surface of the sidewall and one surface and a part of a top surface of the cover, and having a top surface formed to be higher than the top surface of the cover, and forming an OSP coating layer formed on at least the top surface of the connection terminal.

The OSP coating layer may include forming the OSP coating layer on the top surface and a side surface of the connection terminal.

The forming of the OSP coating layer may include forming the OSP coating layer through dipping, spraying, or spin-coating.

According to still another aspect of the present invention, there is provided an SAW wafer level package including a substrate, an IDT formed on the substrate, a sidewall formed on the substrate along a periphery of the IDT, a cover formed above the sidewall and the IDT to form a hollow above the IDT with the sidewall, a connection electrode formed on the substrate, electrically connected to the IDT, and extending outward from a periphery of the sidewall, a connection terminal electrically connected to a part of the connection electrode which extends outward from the periphery of the sidewall, formed throughout one outer surface of the sidewall and one surface and a part of a top surface of the cover, and having a top surface formed to be higher than the top surface of the cover, a cover-protecting layer formed to surround a side surface of the connection terminal and the top surface and a side surface of the cover while exposing at least the top surface of the connection terminal, and an OSP coating layer formed on at least the top surface of the connection terminal.

The top surface of the connection terminal and a top surface of the cover-protecting layer may be substantially in the same plane.

The connection terminal may be formed to protrude above a top surface of the cover-protecting layer, and the OSP coating layer may be formed on the top surface of the connection terminal and a side surface thereof protruding above a top surface of the cover-protecting layer.

According to yet another aspect of the present invention, there is provided a method of manufacturing an SAW wafer level package. The method includes forming a first base device including a substrate, an IDT formed on the substrate, a sidewall formed on the substrate along a periphery of the IDT, a cover formed above the sidewall and the IDT to form a hollow above the IDT with the sidewall, a connection electrode formed on the substrate, electrically connected to the IDT, and extending outward from a periphery of the sidewall, and a connection terminal electrically connected to a part of the connection electrode which extends outward from the periphery of the sidewall, formed throughout one outer surface of the sidewall and one surface and a part of a top surface of the cover, and having a top surface formed to be higher than the top surface of the cover, forming a second base device by forming a cover-protecting layer to surround a side surface of the connection terminal and the top surface and a side surface of the cover while covering the connection terminal, forming a third base terminal by planarizing a top surface of the cover-protecting layer to expose at least the top surface of the connection terminal and to allow the top surface of the connection terminal and the top surface of the cover-protecting layer to be substantially in the same plane, and forming an OSP coating layer formed on at least the top surface of the connection terminal.

The forming of the OSP coating layer may include forming the OSP coating layer through dipping, spraying, or spin-coating.

The method may further include, after forming of the third base device, forming a fourth base device by etching the top surface of the cover-protecting layer to allow the connection terminal to protrude above the top surface of the cover-protecting layer.

The forming of the OSP coating layer may include forming the OSP coating layer on the top surface of the connection terminal and a side surface thereof which is exposed above the top surface of the cover-protecting layer.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Figure 1:
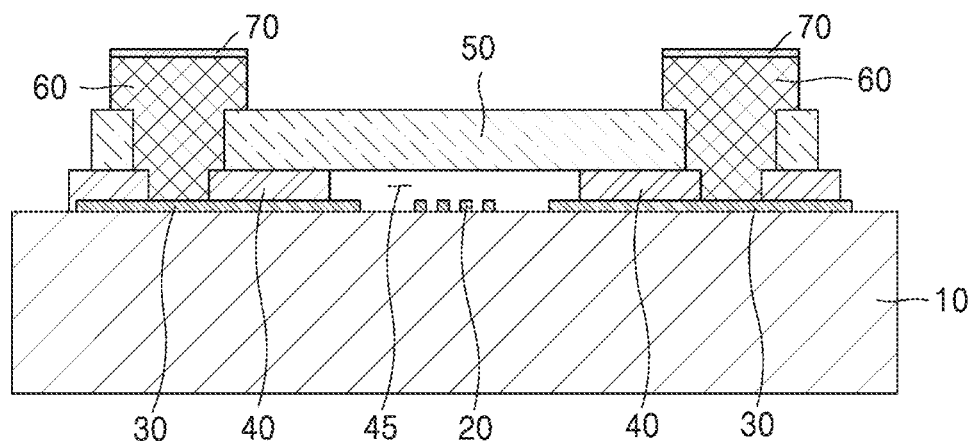
FIG. 1 illustrates a cross-sectional structure of an existing surface acoustic wave (SAW) wafer level package.

Hereinafter, exemplary embodiments of the present invention will be described in detail with reference to the drawings. Hereinafter, throughout the following description and the attached drawings, substantially like elements will be referred to as like reference numerals and a repetitive description thereof will be omitted. Also, in a description of the embodiments of the present invention, a detailed description of well-known functions or components of the related art will be omitted when it is deemed to obscure understanding of the embodiments of the present invention.

Figure 2:
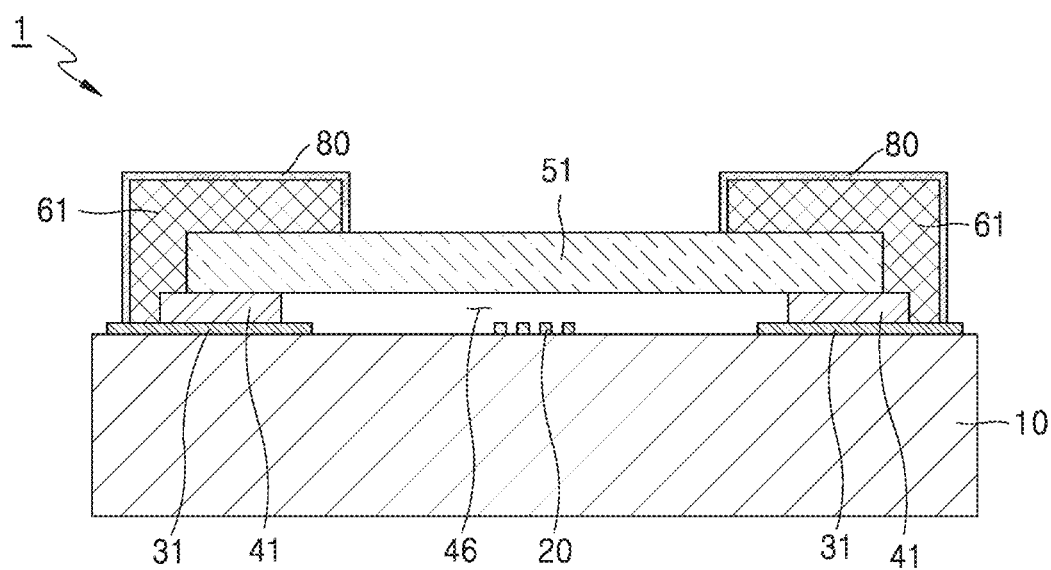
FIG. 2 illustrates a cross-sectional structure of an SAW wafer level package according to a first embodiment of the present invention.

FIG. 2 illustrates a cross-sectional structure of a surface acoustic wave (SAW) wafer level package 1 according to a first embodiment of the present invention.

The SAW wafer level package 1 according to the embodiment includes a substrate 10, an interdigital transducer (IDT) 20, a connection electrode 31, a sidewall 41, a cover 51, a connection terminal 61, and an organic solderability preservative (OSP) coating layer 80.

The substrate 10 performs a function of causing a piezoelectric effect and supporting components of a device and may be a piezoelectric substrate. For example, a piezoelectric substrate including $LiTa_2O_3$, $LiNbO_3$ and the like may be used.

The IDT 20 is formed on the substrate 10. An SAW device is operated as a filter or the like through mechanical vibrations of the IDT 20.

The sidewall 41 is formed on the substrate 10 along a periphery of the IDT 20 to surround the IDT 20. The sidewall 41 may include a material, for example, photoresist or the like.

The cover 51 is formed above the sidewall 41 and the IDT 20 to form a hollow 46 above the IDT 20 with the sidewall 41. The cover 51 may include a material, for example, photoresist or the like.

The connection electrode 31 is formed on the substrate 10 to be electrically connected to the IDT 20 so as to perform a function of a medium to allow the IDT 20 to be electrically connected to an outside. For example, a signal input from an external terminal is transmitted to the IDT 20 through the connection electrode 31, and a signal generated by the IDT 20 is transmitted to the external terminal through the connection electrode 31. In the embodiment of the present invention, the connection electrode 31 is formed to extend from an inside of the sidewall 41 toward a periphery of the sidewall 41.

The connection terminal 61 is electrically connected to a part of the connection electrode 31 which extends outward from the periphery of the sidewall 41 and is formed throughout one outer surface of the sidewall 41 and one surface and a top surface of the cover 51. Also, a top surface of the connection terminal 61 is formed to be higher than the top surface of the cover 51. The connection terminal 61 may include a material, for example, Ti, Cu, Sn, Ni, Au, and the like.

Unlike a structure shown in FIG. 1 in which a connection terminal 60 vertically passes through a sidewall 40 and a cover 50, the embodiment of the present invention has a structure shown in FIG. 2 in which the connection terminal 61 is formed throughout the one outer surface of the sidewall 41 and the one surface and the top surface of the cover 51. Accordingly, an inner surface of the sidewall 41 may be disposed further outside than the sidewall 40 of FIG. 1 so as to form the hollow 46 having a larger area. Accordingly, an area for disposing the IDT 20 increases so that a size or number of such IDTs 20 may be increased.

The OSP coating layer 80 is formed on the top surface and a side surface of the connection terminal 61 and provides improved solderability. The OSP coating layer 80 may be formed to have a thickness of about 5 μm or less. Since the OSP coating layer 80 is formed not only on the top surface but also on the side surface of the connection terminal 61, soldering may be applied to the side surface of the OSP coating layer 80 so that solderability may be further improved.

An OSP forms a thin and uniform film on a surface of copper or the like using an organic compound such as alkylbenzimidazole, diphenylimidazole, and the like. The film formed as described above protects the surface such as copper or the like from outside air and humidity as well as preventing the surface from being oxidized even in a high-humidity environment such as reflow and curing of an adhesive so as to provide a clean surface during soldering. Also, in the case of OSP, since a film is easily formed through a simple process such as spraying, spin-coating, and the like and copper of the like and solder are bonded to each other to an interatomic distance, there is an advantage of excellent adhesion.

Since it is possible to form the OSP coating layer 80 through a simple process such as dipping, spraying, spin-coating, and the like, a complicated process including applying of photoresist, electroplating, eliminating of the photoresist, and the like to form a tin-plating layer 70 may be omitted. Accordingly, in the present invention, high-priced equipment for forming the tin-plating layer is not necessary and a process time is reduced. In addition, since the OSP coating layer 80 is formed to have a certain thickness of 5 μm or less, a process of checking whether a product has fair quality by measuring a thickness thereof like a case of the tin-plating layer 70 may be omitted. The reduction of the process time and the omission of the process of checking whether the product has fair quality significantly reduce a lead time of the product.

Figure 3:
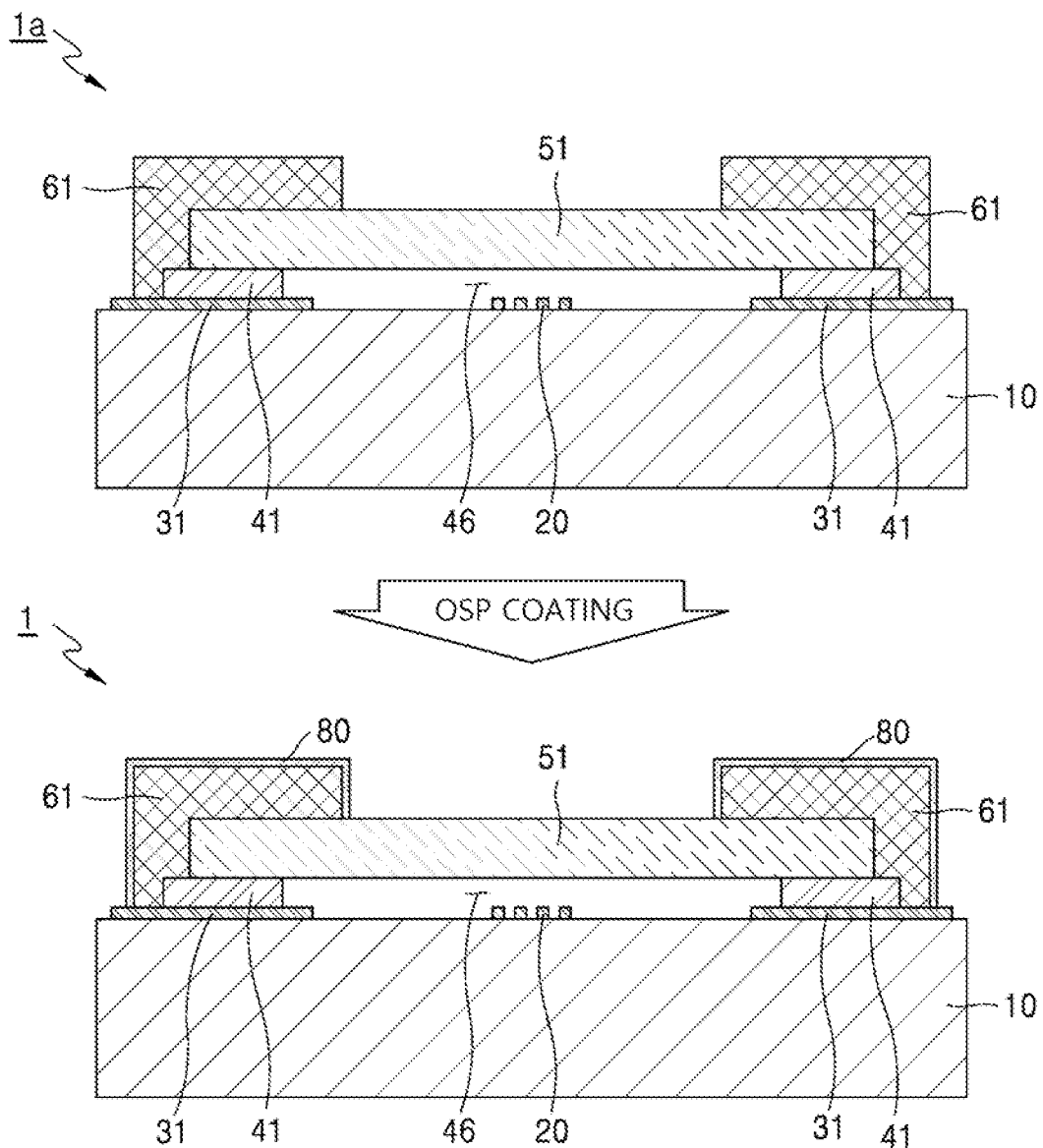
FIG. 3 illustrates a process of manufacturing the SAW wafer level package according to the first embodiment of the present invention.

FIG. 3 illustrates a process of manufacturing the SAW wafer level package according 1 to the first embodiment of the present invention.

As shown in the drawings, a base device 1a including the substrate 10, the IDT 20, the connection electrode 31, the sidewall 41, the cover 51, and the connection terminal 61 is formed.

When the top surface and side surface of the connection terminal 61 of the base device 1a is coated with an OSP solution, the SAW wafer level package 1 according to the first embodiment in which the OSP coating layer 80 is formed on the top surface and the side surface of the connection terminal 61 is completed. OSP coating may be performed by dipping a part or the whole of the base device 1a into the OSP solution or using a process of spraying, spin-coating, or the like.

Figure 4:
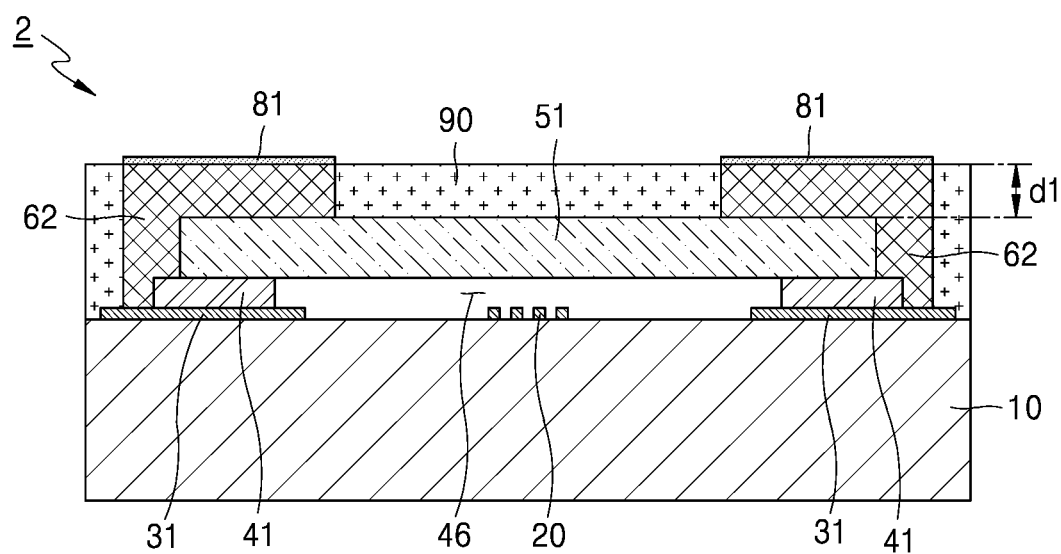
FIG. 4 illustrates a cross-sectional structure of an SAW wafer level package according to a second embodiment of the present invention.

FIG. 4 illustrates a cross-sectional structure of an SAW wafer level package 2 according to a second embodiment of the present invention.

The SAW wafer level package 2 according to the embodiment includes a substrate 10, an IDT 20, a connection electrode 31, a sidewall 41, a cover 51, a connection terminal 62, a cover-protecting layer 90, and an OSP coating layer 81.

Since the substrate 10, the IDT 20, the connection electrode 31, the sidewall 41, and the cover 51 are substantially equal to those of the first embodiment, a detailed description will be omitted.

A part of the connection terminal 62 which protrudes above the cover 51 may have a height relatively higher than that of the first embodiment to correspond to a thickness d1 of the cover-protecting layer 90 which will be described below above a top surface of the cover 51.

The cover-protecting layer 90 may be formed to surround a side surface of the connection terminal 62 and the top surface and a side surface of the cover 51 while exposing a top surface of the connection terminal 62. Also, a top surface of the connection terminal 62 and a top surface of the cover-protecting layer 90 may substantially be in the same plane. In this case, the thickness d1 of the cover-protecting layer 90 above the top surface of the cover 51 is substantially equal to a height of the part of the connection terminal 62 which protrudes above the cover 51.

The cover-protecting layer 90 may include a material such as solid-phase, liquid-phase, or film-shaped epoxy, photoresist, or the like. The cover-protecting layer 90 may protect the cover 51 from an external pressure caused by transfer molding or the like. To this end, the thickness d1 of the cover-protecting layer 90 above the top surface of the cover 51 may be formed to be 20 μm or more. However, when it is possible to protect the cover 51 from an externally applied pressure, the thickness d1 of the cover-protecting layer 90 above the top surface of the cover 51 may be formed to be smaller than 20 μm.

The OSP coating layer 81 is formed on the top surface of the connection terminal 61 and provides improved solderability.

Figure 5A:
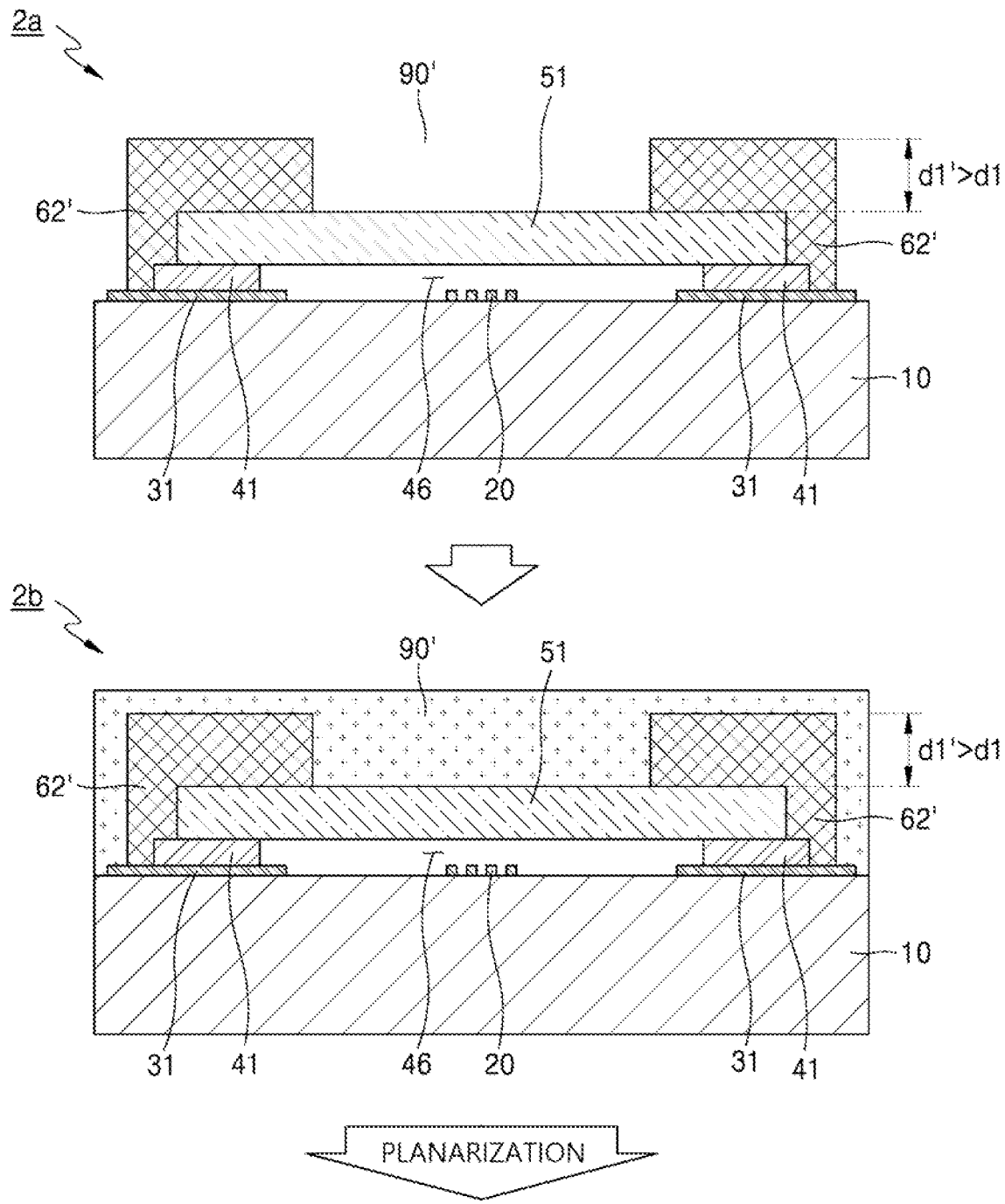
FIGS. 5A and 5B illustrate a process of manufacturing the SAW wafer level package according to the second embodiment of the present invention.
Figure 5B:
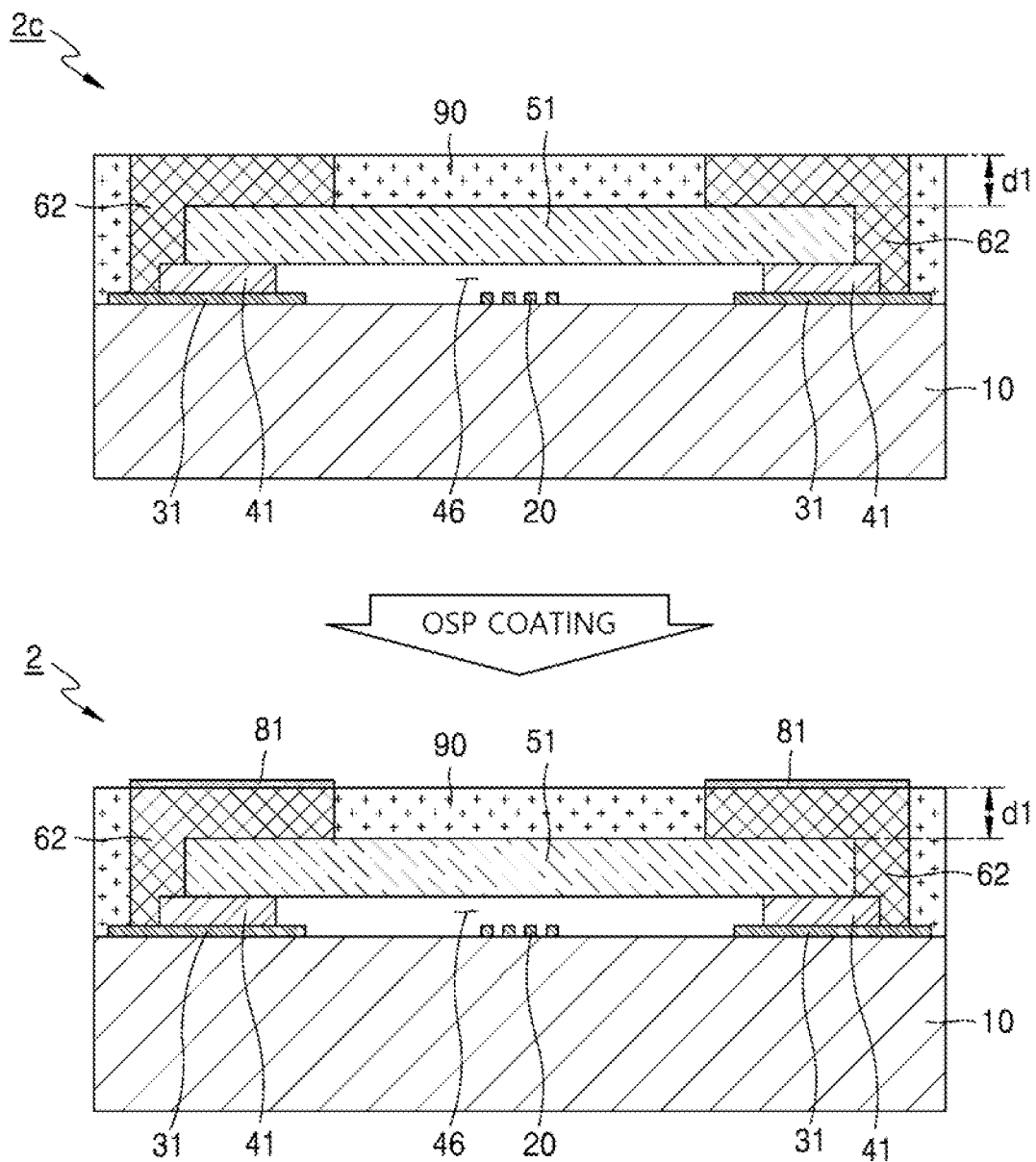

FIGS. 5A and 5B illustrate a process of manufacturing the SAW wafer level package 2 according to the second embodiment of the present invention.

As shown in the drawings, a first base device 2a including the substrate 10, the IDT 20, the connection electrode 31, the sidewall 41, the cover 51, and a connection terminal 62' is formed. Here, a part of the connection terminal 62' which protrudes above the cover 51 has a height d1' higher than the height d1 of the part of the connection terminal 62 to be formed which protrudes above the cover 51.

Subsequently, a second base device 2b is formed by forming a cover-protecting layer 90' to surround a side surface of the connection terminal 62' and the top surface and the side surface of the cover 51 while covering the connection terminal 62'. A thickness of the cover-protecting layer 90' above the top surface of the cover 51 is formed to be greater than the height d1'.

Subsequently, a top surface of the cover-protecting layer 90' is planarized and additionally a top surface of the connection terminal 62' is planarized so as to form a third base device 2c in which the top surface of the connection terminal 62 is exposed and the top surface of the connection terminal 62 and the top surface of the cover-protecting layer 90 are substantially in the same plane. A thickness of the cover-protecting layer 90 above the top surface of the cover 51 is formed to be d1 through planarization. The planarization may be performed by, for example, grinding.

When the top surface of the connection terminal 62 of the third base device 2c is coated with an OSP solution, the SAW wafer level package 2 according to the second embodiment in which the OSP coating layer 81 is formed on the top surface of the connection terminal 62 is completed. OSP coating may be performed by dipping a part or the whole of the third base device 2c into the OSP solution or using a process of spraying, spin-coating, or the like.

Figure 6:
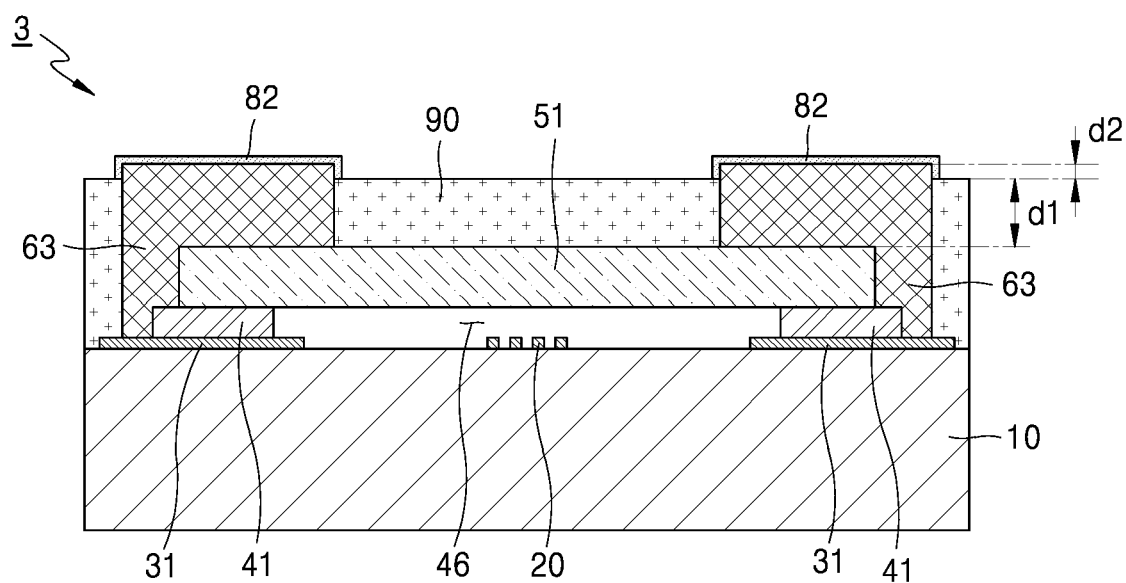
FIG. 6 illustrates a cross-sectional structure of an SAW wafer level package according to a third embodiment of the present invention.

FIG. 6 illustrates a cross-sectional structure of an SAW wafer level package 3 according to a third embodiment of the present invention.

The SAW wafer level package 3 according to the embodiment includes a substrate 10, an IDT 20, a connection electrode 31, a sidewall 41, a cover 51, a connection terminal 63, a cover-protecting layer 90, and an OSP coating layer 82.

Since the substrate 10, the IDT 20, the connection electrode 31, the sidewall 41, and the cover 51 are substantially equal to those of the second embodiment, a detailed description will be omitted.

In the case of the second embodiment, the top surface of the connection terminal 62 and the top surface of the cover-protecting layer 90 are substantially in the same plane. On the other hand, in the embodiment, the connection terminal 63 is formed to protrude above a top surface of the cover-protecting layer 90. For example, a top surface of the connection terminal 63 may be located to be higher than the top surface of the cover-protecting layer 90 by d2, and the cover-protecting layer 90 may be formed to surround a side surface of the connection terminal 63 and a top surface and a side surface of the cover 51 while exposing the top surface of the connection terminal 63 and a part of the side surface which is adjacent to the top surface. A height d2 of the connection terminal 63 which protrudes above the top surface of the cover-protecting layer 90 may be about 10 μm or less.

The OSP coating layer 82 is formed on the top surface of the connection terminal 63 and the side surface thereof which protrudes above the top surface of the cover-protecting layer 90 and provides improved solderability. Since the OSP coating layer 82 is also formed on the side surface of the connection terminal 63, soldering may be applied even to the side surface of the OSP coating layer 82 so that solderability may be further improved.

Figure 7A:
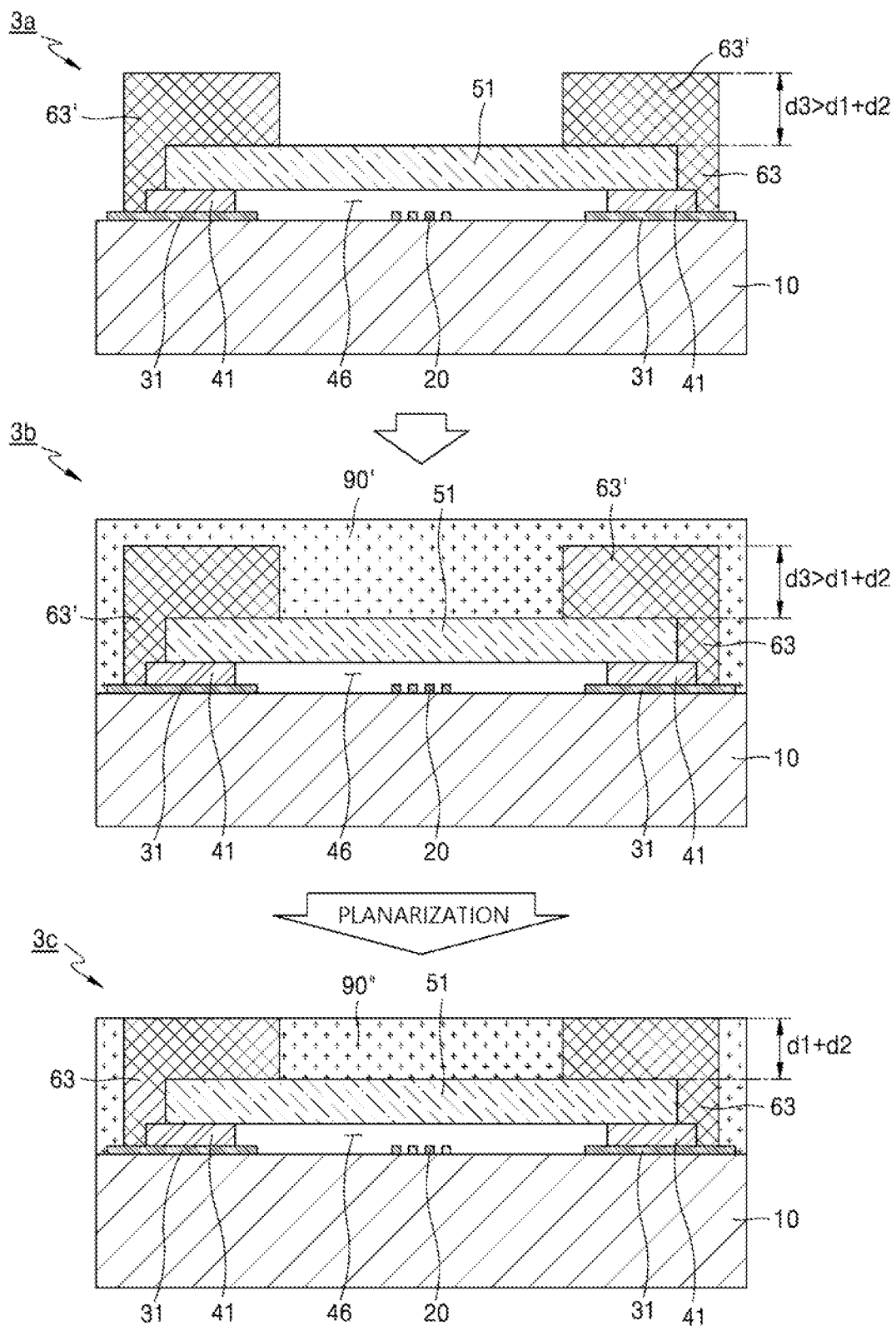
FIGS. 7A and 7B illustrate a process of manufacturing the SAW wafer level package according to the third embodiment of the present invention.
Figure 7B:
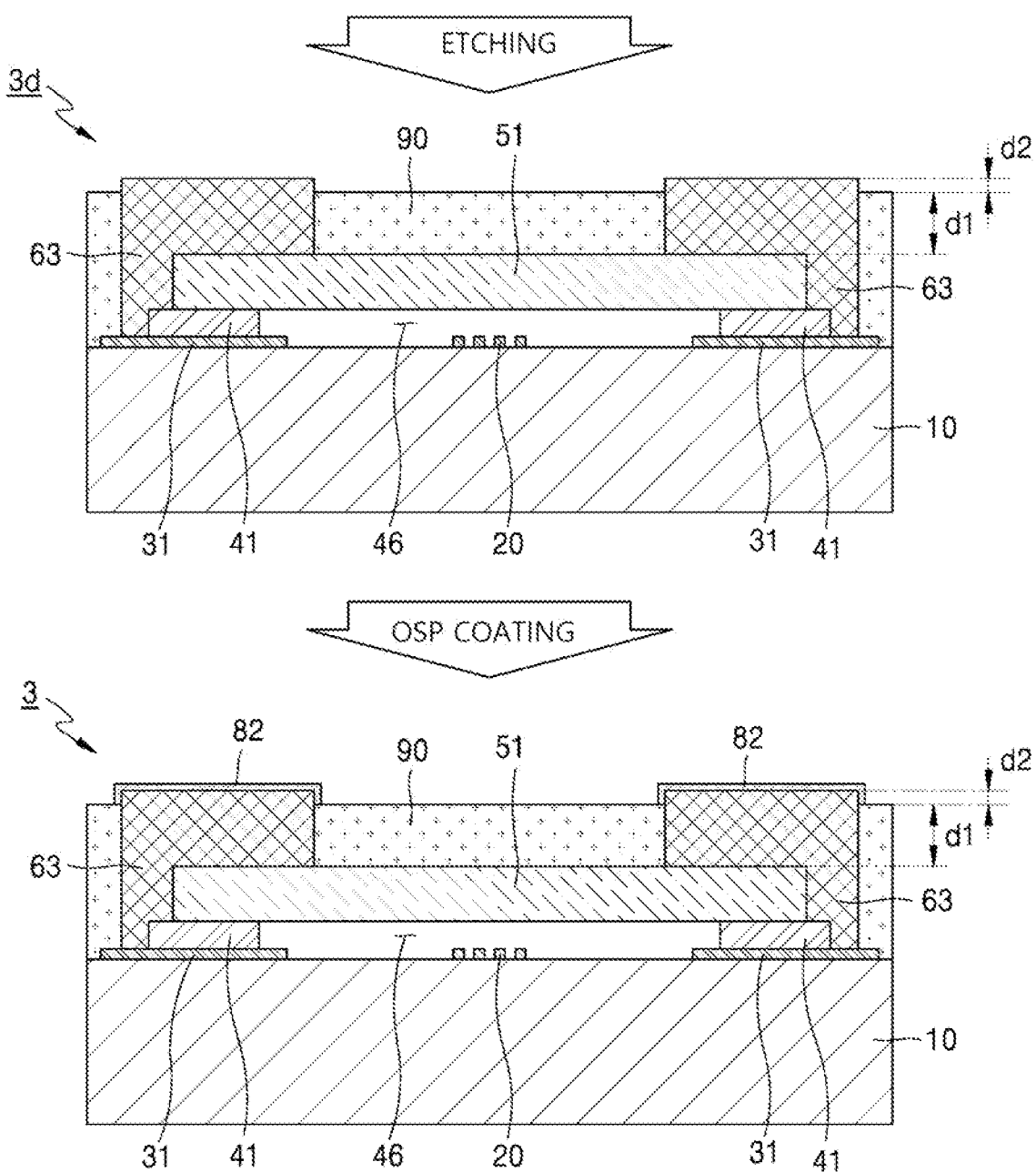

FIGS. 7A and 7B illustrate a process of manufacturing the SAW wafer level package 3 according to the third embodiment of the present invention.

As shown in the drawings, a first base device 3a including the substrate 10, the IDT 20, the connection electrode 31, the sidewall 41, the cover 51, and a connection terminal 63' is formed. Here, a part of the connection terminal 63' which protrudes above the cover 51 has a height d3 higher than a height d1+d2 of the part of the connection terminal 63 to be formed which protrudes above the cover 51.

Subsequently, a second base device 3b is formed by forming a cover-protecting layer 90' to surround a side surface of the connection terminal 63' and the top surface and the side surface of the cover 51 while covering the connection terminal 63'. A thickness of the cover-protecting layer 90' above the top surface of the cover 51 is formed to be greater than the height d3.

Subsequently, a top surface of the cover-protecting layer 90' is planarized and additionally a top surface of the connection terminal 63' is planarized so as to form a third base device 3c in which the top surface of the connection terminal 63 is exposed and the top surface of the connection terminal 63 and the top surface of a cover-protecting layer 90" are substantially in the same plane. A thickness of the cover-protecting layer 90" above the top surface of the cover 51 is formed to be d1+d2 through planarization. The planarization may be performed by, for example, grinding.

Subsequently, the top surface of the cover-protecting layer 90" is etched so as to allow the connection terminal 63 to protrude further than the top surface of the cover-protecting layer 90. Through etching, a fourth base device 3d in which a part corresponding to a thickness as much as d2 is removed from the top surface of the cover-protecting layer 90" is formed. The etching may be performed by, for example, vapor etching.

When the top surface of the connection terminal 63 of the fourth base device 3d and the side surface thereof exposed above the cover-protecting layer 90 are coated with an OSP solution, the SAW wafer level package 3 according to the third embodiment in which the OSP coating layer 82 is formed on the top surface of the connection terminal 63 and the side surface exposed above the cover-protecting layer 90 is completed. OSP coating may be performed by dipping a part or the whole of the fourth base device 3*d* into the OSP solution or using a process of spraying, spin-coating, or the like.

According to the present invention, in an SAW wafer level package and a method of manufacturing the same, an area of a hollow that is a space in which an IDT is disposed may be increased so that a size of number of such IDTs may be increased.

Also, since an OSP coating layer is formed on a top surface of a connection terminal, high-priced equipment for forming a tin-plating layer is not necessary and a process time is reducible. Also, since a process of measuring a thickness of the OSP coating layer is not necessary, there is an effect of further reducing a lead time.

Effects of the present invention are not limited to the above-stated effects and other unstated effects of the present invention will be understood by one of ordinary skill in the art from the following disclosure.

The exemplary embodiments of the present invention have been described above. It should be understood by one of ordinary skill in the art that a modification of the present invention may be implemented without departing from the essential features of the present invention. Therefore, the disclosed embodiments should be considered not in a limitative view but a descriptive view. The scope of the present invention will be defined in the claims not in the above description, and all differences within an equivalent range thereof should be construed as being included in the present invention.

What is claimed is:

1. A surface acoustic wave (SAW) wafer level package comprising:
   a substrate;
   an interdigital transducer (IDT) formed on the substrate;
   a sidewall formed on the substrate along a periphery of the IDT;
   a cover formed above the sidewall and the IDT to form a hollow above the IDT with the sidewall;
   a connection electrode formed on the substrate, electrically connected to the IDT, and extending outward from a periphery of the sidewall;
   a connection terminal electrically connected to a part of the connection electrode which extends outward from the periphery of the sidewall, formed throughout one outer side surface of the sidewall and one outer side surface of the cover and a part of a top surface of the cover, and having a top surface formed to be higher than the top surface of the cover; and
   an organic solderability preservative (OSP) coating layer formed on the top surface and a side surface of the connection terminal,
   wherein the OSP coating layer is formed along to the side surface of the connection terminal and the OSP coating layer directly contacts a part of the connection electrode extending outward from the periphery of the sidewall.

* * * * *